United States Patent [19]

de Leeuwe et al.

[11] Patent Number: 4,484,351

[45] Date of Patent: Nov. 20, 1984

[54] NON-GLASS CHEMICAL CONTAINER

[75] Inventors: Marc de Leeuwe, Aptos, Calif.; Jeffrey S. Beitel, Cheshire, Conn.

[73] Assignee: Union Carbide Corporation, Danbury, Conn.

[21] Appl. No.: 497,229

[22] Filed: May 23, 1983

[51] Int. Cl.³ .............................................. B65D 33/10
[52] U.S. Cl. ........................................ 383/9; 222/107
[58] Field of Search .................. 383/9, 16, 67, 80, 96, 383/906; 222/107

[56] References Cited

U.S. PATENT DOCUMENTS

| | | | |
|---|---|---|---|
| 2,488,779 | 11/1949 | Olson | 50/23 |
| 2,907,495 | 10/1959 | Brous | 222/63 |
| 2,962,193 | 11/1960 | Totten | 222/145 |
| 3,005,474 | 10/1961 | Merchant | 141/104 |
| 3,331,421 | 7/1967 | Lambert et al. | 383/9 X |
| 3,951,148 | 4/1976 | Herb | 383/80 X |
| 4,090,541 | 5/1978 | Cammarata et al. | 383/9 X |
| 4,232,721 | 11/1980 | Martin et al. | 383/9 X |
| 4,244,409 | 1/1981 | Wilson | 222/107 X |
| 4,275,823 | 6/1981 | Credle, Jr. | 222/94 |
| 4,308,904 | 1/1982 | Martin et al. | 383/9 X |
| 4,335,770 | 6/1982 | Kulle et al. | 383/9 X |
| 4,368,765 | 1/1983 | Larkin et al. | 383/9 X |
| 4,412,573 | 11/1983 | Zdeb | 383/9 X |

Primary Examiner—Steven M. Pollard
Attorney, Agent, or Firm—Frederick J. McCarthy, Jr.

[57] ABSTRACT

A storage container is formed by joining together the sides and top of a pair of matched laminated flat sheets. The bottom portions are joined together adjacent the sides, but the center is sealed along the sealing surfaces of a tube connector assembly, the connector portion being in the form of a parallel pipe head, the center of which is enclosed a tube. The tube extends through the connector and projects outwardly therefrom to provide a closable access path for filling and draining the container. The projected portion of said tube is corrugated.

A sleeve is formed along the top edge of the sealed top portion of sealed container and a stiffener rod is installed in the sleeve to provide a more stable structure for handling when the container is filled. Below the sleeve and horizontally centered is a hook mounting aperture for holding the container in the drain position. Disposed symmetrically on opposite sides of said hook mounting aperture are a pair of gripping apertures which facilitate handling of the container. At the bottom are a pair of sealed flaps disposed on each side of said tube projection and within each flap is an aperture. These apertures are used to hold a container during the filling cycle.

A shut-off cap is a tubular structure and has a wide section, the interior of which fits over the tube projection and a narrow section. The interior walls of said wide section are corrugated so that a fluid tight fit is obtained when installed on said tube projection. A membrane, which seals the shut-off cap, is formed at the junction of the wide and narrow sections of said shut-off cap. A dust cover is attached by a flexible lead and is designed to fit over a part of the narrow section, thus preventing dust and other contaminants from getting into the narrow tube during storage and transport.

9 Claims, 10 Drawing Figures

NON-GLASS CHEMICAL CONTAINER

BACKGROUND OF THE INVENTION

1. Field of the Invention

This invention relates to containers for storage, transport and use of liquid chemicals such as photoresists, i.e., modified phenolic solution, and more particularly to a flexible, collapsible pouch-type container formed by sealing the sides and top of a pair of matched laminated sheets and closing the bottom by means of a connector assembly that includes a tube for filling and draining the pouch.

2. Description of the Prior Art

Because of its almost chemically inert characteristic, glass has long been used for the storage, transport and use of may chemicals, including photoresist. The use of glass, however, introduces several problems. One is that glass must be carefully handled in order to prevent breakage. There must be storage space both for the unused and used glass containers, a problem that is substantially reduced when the container becomes essentially flat when empty.

SUMMARY OF THE PRESENT INVENTION

A chemical container for storing, transport and use in industrial applications is formed from a pair of flat substantially matching, opposed plastic sheets, e.g., polyethylene, suitably rectangular, sealed together at the edges of the sides and top and bottom portions forming a rim of increased stiffness and strength surrounding a pouch comprised of the opposing sheets having a center opening at its bottom. In a preferred embodiment of the invention, each sheet is a plastic laminate comprised of a layer of corrosion resistant material such as polyethylene and a layer of relatively high strength material such as nylon. A tube connector assembly includes a tube located in its center which projects outwardly to provide access to the enclosed pouch for the filling and draining thereof. The connector assembly includes a parallelepiped shaped housing which is integral with the tube and provides sealing surfaces and strengthening tabs which are sealed to the bottom portion of the pouch.

IN THE DRAWING

DETAIL DESCRIPTION OF THE PREFERRED EMBODIMENT

Figure 1:
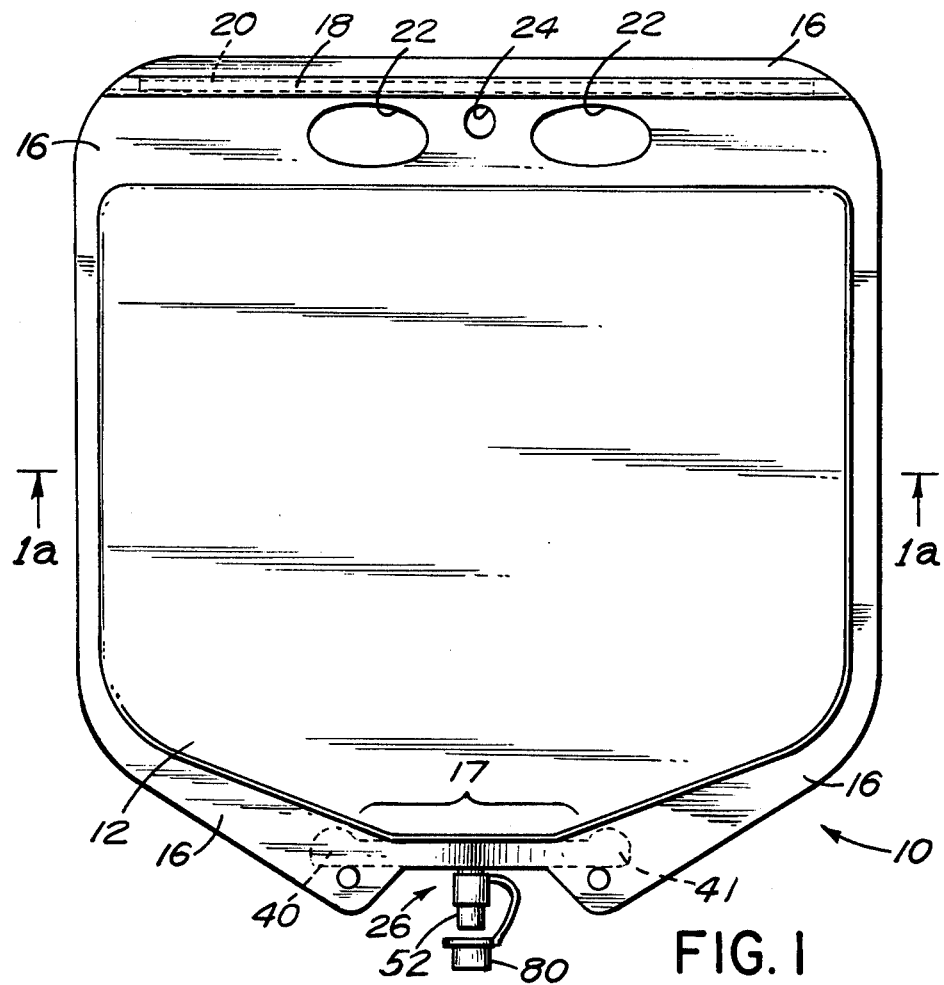
FIG. 1 is an elevation view of the pouch-type chemical container of a particular embodiment of the invention.
Figure 1A:
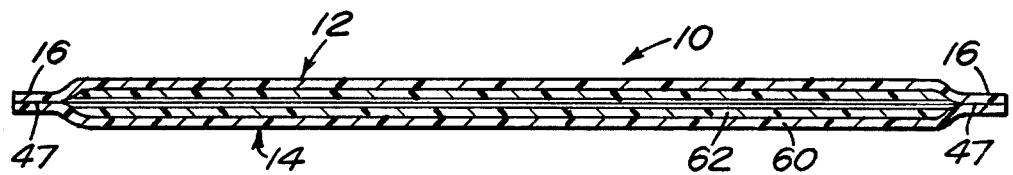
FIG. 1(a) is a cross-section view of the pouch of FIG. 1 when empty.
Figure 1B:
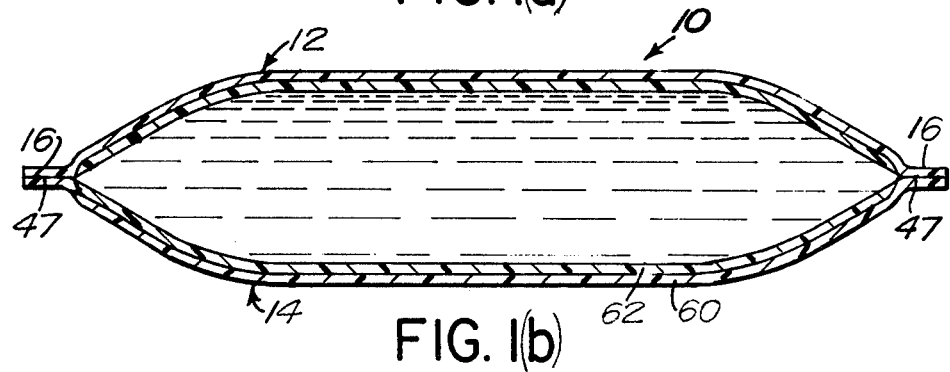
FIG 1(b) is a cross-section view of the pouch of FIG. 1 when filled with liquid chemical, e.g., photoresist.
Figure 2:
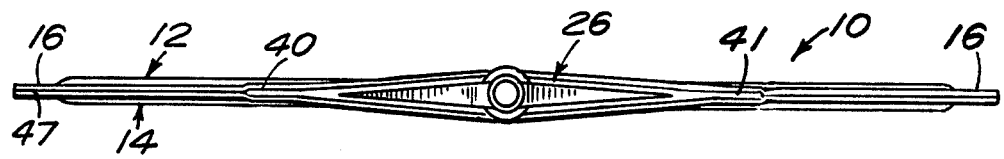
FIG. 2 is a bottom plan view of the pouch of FIG. 1.

Referring now to FIGS. 1, 1(a) and 1(b), an elevation view of a preferred embodiment of chemical container for storing, transport and use in industrial applications is shown. The pouch 10 is made of a pair of flat substantially rectangular laminated plastic sheets 12, 14 sealed around the periphery thereof, except at the lower most bottom central portion indicated at 17 in FIG. 1 to form a rim of increased stiffness and strength indicated at 16. A sleeve 18 is formed by leaving unsealed a strip of sheets 12, 14 near the top edge of the container which accepts a stiffener rod 20 which provides stability and facilitates handling of the filled pouch 10. To this end, a pair of gripping aperatures 22 are located in the top portion of rim 16 contiguous to the sleeve 18 and adjacent to the bottom edge of rim 16. In conjunction with sleeve 18 and stiffener rod 20, aperatures 22 provide the gripping access necessary for convenient movement of said chemical container. The gripping apertures 22 are symmetrically displaced about the vertical central axis of the pouch 10 and a hook mounting aperture 24 is located on the central axis between the gripping aperatures 22. By this arrangement an operator can easily slide the hook mounting aperture over the hook of a pouch stand (not shown) or similar device, so that chemicals stored therein may be ready for use in an industrial process.

At the bottom of the pouch 10 is a rigid, parallelepiped shaped drain assembly 26, having extended tabs 40, 41, shown in detail in FIGS. 2 and 3, 3(a) and 3(b), which is inserted in and is sealed with the bottom center portion 17 of the laminated sheets to provide access to the chemical pouch 10. In making the pouch 10 of the present invention, parallelepiped assembly 26, the parallelogram faces of which are preferably equilateral and in the shape of a rhombus, is arranged between laminated sheets 12, 14 with the plane of its major axes parallel to the sheets and the parallelepiped surfaces 30, 31 and 32, 33 are sealed to the sheets 12, 14 as are the surfaces 43, 44 and 45, 46 of the thin essentially planar, integral tabs 40, 41 of parallelepiped assembly 26. Subsequently, the rest of the edge portions of sheets 12, 14 are sealed to form rim member 16. The assembly 26 includes an integral tube 52 which enables transmission of fluid between the pouch 10 and external equipment. The tabs 40, 41 provide stress relief for the seal between the pouch 10 and parallelepiped surfaces 30, 31, 32, 33 in the event of twisting during handling and ensure the stability of the seal which is enhanced by the large obtuse angles 50 of the assembly 26, suitably 150° or more.

During the fill operation, the unfilled pouch 10 of FIG. 1(a) will change shape and a section view of a filled pouch is shown in FIG. 1(b). The laminated plastic sheets 12, 14 are sealed together as shown at 47, suitably by conventional heat sealing, e.g., welding. The present invention is applicable for use with liquid chemicals generally and the selection of laminate materials to withstand various chemical activity, avoid contamination of the chemicals stored within the pouch, and provide the necessary protection against abuse of the chemical container during handling thereof are known to the art as are the techniques for sealing (welding) the edges to form a rim for the container. In the preferred embodiment of the invention, the laminated plastic sheets are formed of nylon, indicated at 60, and polyethylene, indicated at 62. An aluminum coating can be provided to enhance resistance to light. These materials have been found to provide desired structural strength as well as protection against leaching and contamination of the chemicals by the chemical container. Other suitable materials include Teflon, Mylar, rubber, polyvinylchloride and other thermoplastic and thermosetting materials well known to the art. The preferred material for the parallelepiped assembly 26 is polyethylene.

Figure 3:
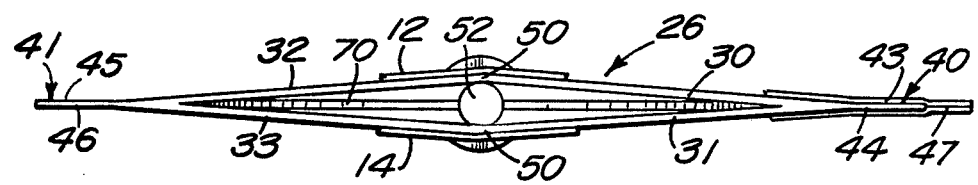
FIG. 3 is a bottom plan view of the tube connector assembly of FIG. 2 shown enlarged.
Figure 3A:
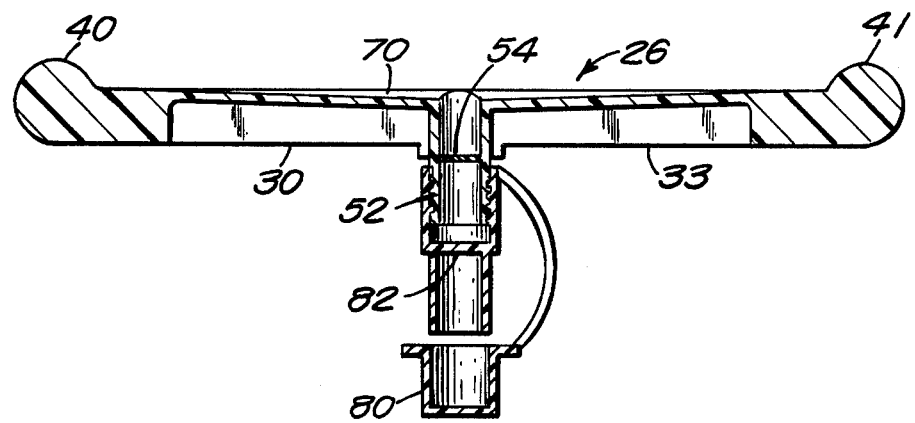
FIGS. 3(a) and 3(b) are, respectively, elevation and top plan views of the assembly of FIG. 3.
Figure 3B:
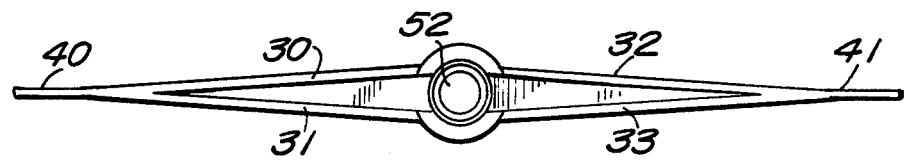
Figure 4:
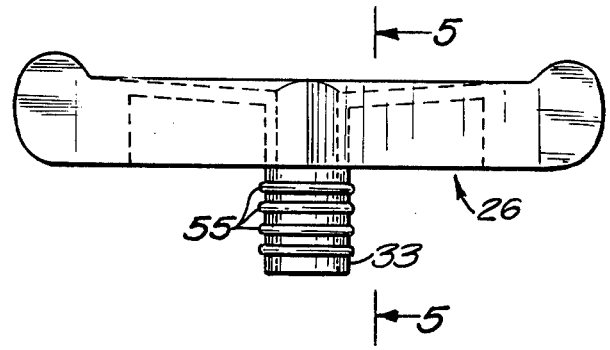
FIG. 4 is a section view taken along the lines 4—4, showing structural details of the fill/drain tube connector assembly.
Figure 5:
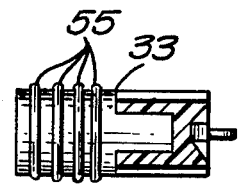
FIG. 5 is a section view taken along the lines 5—5, and illustrates a side view of the fill/drain tube connector assembly of FIG. 4.

With reference to FIGS. 3 and 3(a), assembly 26 is provided with downwardly sloping grooves 70 which assist in the efficient flow of liquid from pouch 10 through tube 52. Hollow tube 52 extends through assembly 26 to provide access to the interior of the pouch 10 and projects outwardly therefrom. The outward projection 33 is corrugated, shown as ribs 55 in FIG. 4, to provide for a fluid shut-off connection. A side view of the tube connector assembly is shown in FIG. 5, where it may be noted that the outboard wall of the connector portion is recessed and the in board portion is notched.

Figure 6:
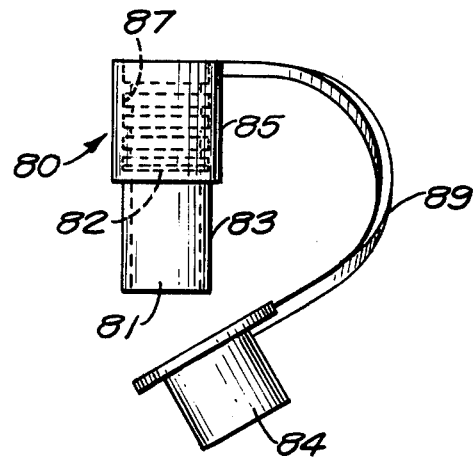
FIG. 6 is a shut-off cap for the tube projection.

Once filled, the pouch 10 may be sealed with an air seal such as is provided by shut-off cap 80, e.g., made of polyethylene, illustrated in FIG. 6. The shut-off cap 80 consists of a tubular arrangement 81 having narrow and wide sections 83 and 85. The interior of the wide section 85 being corrugated as shown at 87 to mate with the corrugations i.e. ribs 55 on the tube connector assembly so as to form a fluid tight seal. A membrane 82 integral with tube 81 provides the air tight closure of the pouch 10 when the shut-off cap 80 has been properly fitted on the tube projection 53. The narrow tubular section 83 of shut-off cap 80 may be fitted with a dust cap 84 which fits over the bottom end 86 and is attached to cap 80 by flexible strap 89. As may be noted from the structure just described, the tube projection 53 and the shut-off cap 80 are designed to be used with a conventional ultra-clean medical type connector which pierces seal 83 when in place. This permits a cleaner tie-in to the chemicals than is available from glass containers. The function of dust cap 84 is to prevent the accumulation of dust or other contaminates in the bottom portion 86 of the shut-off cap 80 during transport or storage.

Although the present invention has been described herein in terms of a presently preferred embodiment, it will be appreciated by those skilled in the art that alterations and modifications thereof may readily be made to suit particular needs and applications. It is therefore intended that the following claims be interpreted as covering all such alterations and modifications as fall within the true spirit and scope of the invention.

We claim:

1. A chemical container, for storing, transport and use in industrial applications, which employ liquid chemicals such as photoresist used in electronic circuit processing, comprising:
   a pair of flat, opposed, closely adjacent matching plastic sheets sealed together at their edges except at a relatively small axially central position to form a rim member surrounding a receptacle enclosed by the opposed sheets, said receptacle having an aperture where the sheets are not sealed together;
   a rigid parallelepiped shaped sealing assembly having the plan of its major axes parallel to said sheets located in said aperture in contact with said opposed sheets and sealed thereto, said assembly having a central opening to permit filling and emptying of said receptacle.

2. A chemical container as set forth in claim 1 wherein said sealing assembly has relatively thin, planar tabs on each side extending in the plane of its major axes.

3. A chemical container as set forth in claim 1 wherein said sealed sheets include in the sealed portion diametrically opposite from said segment a sleeve near the outer edge providing access for a stiffner rod.

4. A chemical container as set forth in claim 3 including:
   a pair of gripping apertures located adjacent to but symmetrically disposed one on each side of a center line which passed through the center of said tube, said apertures also being below said sleeve and within the sealed area opposite said tube; and
   a hook mounting aperture located between said pair of gripping apertures along said center line for holding said container in position to discharge the chemicals stored within.

5. A chemical container as set forth in claim 4 comprising a pair of fill support apertures, one adjacent each side of said segment for holding said container in position for filling during a filling cycle.

6. A chemical container as set forth in claim 5 wherein said central opening is provided with a tube extending outward from said container wherein a portion of the exterior surface of said tube is corrugated.

7. A chemical container as set forth in claim 6 wherein a shut-off cap is press fitted onto said corrugated tube upon completion of said chemical filling cycle so as to prevent contamination as well as spillage of said chemicals from said container.

8. A chemical container as set forth in claim 7 wherein said shut-off cap comprises:
   a tubular member having a wide diameter portion and a narrow diameter portion, said wide diameter portion being of a sufficient size to mate with and pass over said corrugated tube, the inside surface of said wide diameter portion being corrugated so as to form a fluid tight connection with said corrugated tube; and
   a membrane disposed at the junction of said wide and narrow portions forming a seal for storage and transport of chemicals in said container.

9. A shut-off cap as set forth in claim 8 including a dust cap for said narrow end, said dust cap being attached to said shut-off cap by a flexible lead.

* * * * *